United States Patent
Celik et al.

(10) Patent No.: US 11,835,565 B2
(45) Date of Patent: Dec. 5, 2023

(54) FIELD PROBE AND METHOD FOR CONDUCTING ANTENNA MEASUREMENTS

(71) Applicant: Rohde & Schwarz GmbH & Co. KG, Munich (DE)

(72) Inventors: Mert Celik, Munich (DE); Hendrik Bartko, Unterhaching (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 245 days.

(21) Appl. No.: 17/355,562

(22) Filed: Jun. 23, 2021

(65) Prior Publication Data

US 2022/0034952 A1 Feb. 3, 2022

(30) Foreign Application Priority Data

Jul. 28, 2020 (EP) .................................... 20188151

(51) Int. Cl.
 *G01R 29/10* (2006.01)
 *G01R 29/08* (2006.01)

(52) U.S. Cl.
 CPC ......... *G01R 29/10* (2013.01); *G01R 29/0878* (2013.01)

(58) Field of Classification Search
 CPC .... H01Q 3/267; G01R 29/0878; G01R 29/10; G01R 29/105
 See application file for complete search history.

(56) References Cited

U.S. PATENT DOCUMENTS

| 7,035,594 B2* | 4/2006 | Wallace ................. H01Q 25/00 455/115.2 |
| 10,422,823 B2 | 9/2019 | Tankielun et al. |
| 2007/0063905 A1* | 3/2007 | Garreau ............ G01R 29/0857 343/703 |
| 2009/0085827 A1* | 4/2009 | Orime ....................... G01S 7/03 343/893 |
| 2018/0031622 A1 | 2/2018 | Tankielun et al. |
| 2019/0348760 A1 | 11/2019 | Lee |

(Continued)

FOREIGN PATENT DOCUMENTS

| CN | 110 470 914 A | 11/2019 |
| EP | 3 279 675 A1 | 2/2018 |
| EP | 3 432 491 A1 | 1/2019 |

OTHER PUBLICATIONS

Lehto, Arto O., Jussi Tuovinen, Olga Borić and Antti V. Raisanen. "Antenna Phase Pattern Measurements using Three Power Meters.", Oct. 1, 1992, 1992 22nd European Microwave Conference, 1, p. 515-520. (Year: 1992).*

(Continued)

*Primary Examiner* — Ab Salam Alkassim, Jr.
*Assistant Examiner* — Leah Rosenberg
(74) *Attorney, Agent, or Firm* — Westman, Champlin & Koehler, P.A.

(57) ABSTRACT

Field probe for conducting antenna measurements by phaseless measurements. An antenna arrangement comprises three or four antennas for measuring RF waves. The measured RF waves are pairwise added and subtracted. Based on the result of the adding and subtracting operations, magnitude patterns and phase patterns are determined. In this way, magnitude and phase patterns of electromagnetic waves emitted by a device under test can be determined by a completely passive device.

15 Claims, 2 Drawing Sheets

(56) References Cited

U.S. PATENT DOCUMENTS

2020/0021370 A1  1/2020  Huynh et al.

OTHER PUBLICATIONS

Lehto, Arto O., Jussi Tuovinen, Olga Borić and Antti V. Raisanen. "Antenna Phase Pattern Measurements using Three Power Meters.", Oct. 1, 1992, 1992 22nd European Microwave Conference, 1, p. 515-520. (Year: 1992) (Year: 1992).*
Extended European search report for European Patent Application No. 20188151.3, dated Feb. 1, 2021, 8 pages.
Costanzo, Sandra et al., "A Novel Hybrid Approach for Far-Field Characterization From Near-Field Amplitude-Only Measurements on Arbitrary Scanning Surfaces", 1866 IEEE Transactions on Antennas and Propagation, vol. 53, No. 6, Jun. 2005, 0018-926X/$20.00 © 2005 IEEE, 10 pages.

* cited by examiner

FIELD PROBE AND METHOD FOR CONDUCTING ANTENNA MEASUREMENTS

CROSS-REFERENCE TO RELATED APPLICATION

This application claims priority to European Patent Application No. 20188151.3, filed Jul. 28, 2020, the content of which is incorporated by reference in its entirety.

TECHNICAL FIELD

The present invention relates to a field probe for conducting antenna measurements, in particular a field probe for conducting antenna measurements by phaseless measurements. The present invention further relates to a method for conducting antenna measurements by phaseless measurements.

BACKGROUND

Even though applicable in general to any measurements of electromagnetic fields, the present invention and its underlying problem will be hereinafter described in conjunction with measurement of near field properties of an antenna under test.

When performing antenna measurements, in particular measurements of millimeter wave antennas, an antenna under test may emit electromagnetic waves, and the emitted electromagnetic waves may be received by a number of one or more measurement antennas. The measurement antennas may measure the received electromagnetic waves and forward the received signals to a measurement device, for example a vector network analyzer or the like.

For this purpose, the antenna and the measurement device have to be connected by expensive radio frequency coaxial cables, rotary joints, connectors. Further, additional devices such as RF amplifiers, mixers or switches may be needed to transfer the signals received by the antenna to the measurement device. In case that a near field to far field transformation is required, phase information of the received signals is needed, and thus, phase-stable cables and specialized cabling arrangement is also needed. All these requirements result in a complex and expensive test arrangement.

SUMMARY

Against this background, the present invention aims to provide an improved and simplified probe for measuring electromagnetic waves, in particular for performing antenna measurements. In particular, the present invention aims to provide a probe arrangement, which allows antenna measurements by phaseless measurements.

The present invention provides a field probe and a method for conducting antenna measurements with the features of the independent claims. Further advantageous embodiments are subject-matter of the dependent claims.

According to a first aspect, a field probe for conducting antenna measurements is provided. In particular, the field probe may conduct the antenna measurements by phaseless measurements. The field probe comprises an antenna arrangement and a radio frequency, RF, circuitry. The antenna arrangement comprises a number of three or four antennas. The three or four antennas share a common center point. Each of the antennas is configured to measure radio frequency waves emitted by a device under test, in particular an antenna under test. The RF circuitry is directly connected to the number of antennas. Further, the RF circuitry is configured to receive the measured RF waves from each of the antennas. The RF circuitry is further configured to add the measured RF waves, and to subtract the measured RF waves. The RF circuitry is further configured to determine a magnitude pattern and/or a phase pattern of the device under test. In particular, the magnitude pattern and/or the phase pattern may be determined based on the added RF waves and the subtracted RF waves.

According to a further aspect, a method for conducting antenna measurements, in particular for conducting antenna measurements by a phaseless measurement is provided. The method comprises a step of measuring radio frequency, RF, waves by an antenna arrangement. The antenna arrangement may comprise a number of three or four antennas. In particular, the number of antennas may share a common center point. The method further comprises a step of adding the measured RF waves and a step of subtracting the measured RF waves. Further, the method may comprise a step of determining a magnitude pattern and/or a phase pattern of the device under test. In particular, the magnitude pattern and/or the phase pattern may be determined based on the results of the added RF waves and the subtracted RF waves.

The present invention is based on the finding that a conventional measurement arrangement for measuring electromagnetic waves, in particular an antenna pattern of an antenna under test, may require a complex and expensive test arrangement. In particular, a huge number of expensive high quality elements such as phase stable cables, rotary joints or connectors, amplifiers, mixers or switches may be needed for transferring the energy of received RF signals to a measurement device.

The present invention takes into account this finding and aims to provide a simplified test arrangement, in particular an improved field probe for measuring RF waves, e.g. for measuring electromagnetic waves for performing antenna measurements. Especially, the present invention aims to provide a field probe, which allows antenna measurements without the need of phase measurements.

For this purpose, the present invention proposes a field probe with an antenna arrangement of three or four antennas, wherein the individual antennas are arranged in a specific predetermined configuration. In particular, the antennas are arranged such that the antennas share a common center point. For example, each of the antennas may comprise a corner or edge, which is connected to this particular center point. In this way, the number of the three or four antennas is arranged in a particular predetermined and well-known position with respect to the other antennas. For example, the respective corner of the individual antennas may be electrically coupled to the center point. For this purpose, the respective corner of the antennas may be soldered together at this center point. However, any other appropriate manner for an antenna arrangement with a common center point of the individual antennas may be possible.

The antennas of the antenna arrangement may be any kind of appropriate antennas. In particular, the individual antennas may be adapted to the desired frequency range which shall be measured by the field probe. For example, the individual antennas may be realized as horn antennas or the like. However, it is understood, that any other kind of appropriate antenna for the desired frequency range may be possible, too.

The RF circuitry of the field probe is directly connected to the output ports of the individual antennas. In this connection, the term directly means that input terminals of the RF circuitry are connected to the output ports of the antennas without any further element between. At most a very short conducting element may be used for electrically coupling the output port of the antennas with the corresponding input ports of the RF circuitry. In this way, the RF circuitry is located within close proximity of the antenna arrangement. Thus, no additional components such as RF connectors, RF cables, amplifiers, mixers or the like are required between the output port of the antennas and the input ports of the RF circuitry.

The RF circuitry of the field probe performs appropriate operations on the received RF signals provided by the antennas of the antenna arrangement. In particular, the RF circuitry determines magnitude patterns and/or phase patterns based on the measured RF waves. For this purpose, the RF circuitry may perform appropriate operations in order to obtain sums of the received RF waves and differences between the received RF waves. For example, the RF circuitry may pairwise add the RF waves from the individual antennas. Accordingly, the RF circuitry may also determine differences between two received RF waves, respectively. Based on these sums and differences of the received RF waves, the RF circuitry may determine values of a magnitude pattern and/or a phase pattern. In particular, the magnitude pattern and the phase pattern may correspond to the electromagnetic waves received by the antennas of the antenna pattern.

As will be described below in more detail, the determination of the sums and the differences of the RF waves may be performed by any appropriate manner. For example, the RF circuitry may comprise a particular component, for example a circuitry, which outputs a signal corresponding to a sum or a difference of two input signals. In particular, the sums and differences may be determined in real time. Accordingly, the output values for the sums and the differences continuously may correspond to the respective input values. In other words, the values for the sums and the differences of the RF waves continuously correspond to the input values without any operations like averaging or the like.

In this way, the field probe may provide measures for the magnitudes and the phases of an electromagnetic field only by phaseless measurement of the RF waves by three or four antennas. In particular, the magnitude and phase information are determined without considering the phases of the individual received RF waves. Further, it is also not necessary to take into account any further phase information, for example a reference phase or the like.

In this way, the measurement of an electromagnetic field, for example an antenna pattern of an antenna under test, can be simplified. Especially, the measurement may be performed by hardware requiring only low costs. Furthermore, the field probe arrangement can perform a measurement for determining magnitude patterns and/or phase patterns without the need of moving around the individual antennas. Thus, additional hardware components for moving or positioning the individual antenna elements can be omitted.

The information or signals relating to the determined patterns for specifying the magnitude and/or phase may be provided in any appropriate manner. For example, the RF circuitry may comprise an output terminal, which may be connected to a further measurement device receiving the signals relating to the magnitude and/or phase. However, the signals for outputting the determined magnitude and/or phase may be provided by means of relative simple cables. In particular, it is not necessary to connect the output terminal of the RF circuitry by specialized cables such as phase stabilized cables or expensive RF cables.

Since the field probe may provide magnitude pattern and phase patterns based on a phaseless measurement, the determined magnitude and phase pattern may be used for near field analysis, for example a near field analysis of an antenna pattern. Furthermore, the determined magnitude and phase patterns may be used, for example, for a near field to far field transformation. However, it is understood, that any other application may be possible, too.

Further embodiments of the present invention are subject of the further sub-claims and of the following description, referring to the drawings.

In a possible embodiment, the RF circuitry may comprise an adding device. The adding device may be configured to add the measured RF waves in pairs. The RF circuitry may be further configured to determine magnitude values of the magnitude patterns only based on the sums of the added RF waves.

The adding device may be any kind of appropriate element for receiving at least two input signals and outputting a signal corresponding to a sum of the received input signals. In particular, the adding device may be a passive device for providing the output signal corresponding to the sum of the input signals without any use of active components such as amplifiers or the like. In particular, the adding of the input signals may be performed in an analogue domain without digitizing the input signals. For example, a separate adding device may be provided for each pairwise combination of the three or four antennas of the antenna arrangement. However, it may be also possible, in the case of four antenna elements, that only a number of four antennas may be provided. For example, only output signals of horizontal or vertically neighboring antennas may be taken into account for adding the output signals, respectively.

In a possible embodiment, the RF circuitry may comprise a subtracting device. The subtracting device may be configured to subtract the measured RF waves in pairs. The RF circuitry may be further configured to determine phase values of the phase pattern by dividing the differences of the subtracted RF waves by the corresponding sums of the added RF waves.

Similar to the adding device, the subtracting devices may be also realized by passive components without the need of active elements such as amplifiers or the like. In particular, it may be possible to use a similar configuration of adding devices and subtracting devices. Accordingly, for each desired combination of antennas, a relating adding device and subtracting device may be provided. In this way, the magnitude value may be determined only based on the result of the adding device, and the corresponding phase value may be determined by dividing the difference value provided by the subtracting device by the sum provided by the adding device. Thus, not only magnitude but also phase values can be determined without the need of directly measuring any phases.

In a possible embodiment, the RF circuitry may further comprise a power measurement device. The power measurement device may be configured to determine a power value of the measured RF waves. The power measurement device may be also realized, for example, only by passive components without the need of any active elements. Any appropriate power measurement device, for example a power measurement diode or the like may be used for measuring an output power of an antenna. The determined power of the RF waves may be also taken into account for determining the magnitude values and/or the phase values.

For example, the determined values may be normalized with respect to the determined power.

In a possible embodiment, the magnitude pattern and/or the phase pattern may be determined without referring to a reference phase. As already mentioned above, the present invention allows determining magnitude values and phase values only by phaseless measuring of RF waves. Accordingly, the magnitude values and the phase values can be determined based on the received RF waves without the need of any complex and expensive elements for receiving or conducting phase stable signals. Furthermore, there is also no need for receiving a reference phase, for example, from the device under test, in particular an antenna under test.

In a possible embodiment, the RF circuitry may be arranged on a printed circuit board (PCB). The printed circuit board may be directly coupled to the antenna arrangement.

For example, input terminals of the RF circuitry on the PCB may be directly soldered to output ports of the individual antennas of the antenna arrangement. If necessary, only a short conducting element without any additional active or passive components may be arranged between the output port of the antenna and the corresponding input port of the RF circuitry may be used for electrically coupling the antenna and the RF circuitry. Depending on the available space and the configuration of the antennas in the antenna arrangement, it may be also possible to split the RF circuitry to multiple PCB. For example, separate PCBs may be provided for separate combinations of antennas or separate PCBs may be provided for adding the RF waves and for subtracting the RF waves. However, it is understood, that any other appropriate configuration of the RF circuitry on one or more PCBs may be possible, too.

In a possible embodiment, the number of antennas are connected to the RF circuitry, in particular to the PCB, without any additional wire. In this case, the output terminals of the antennas are directly connected to input terminals of the RF circuitry. For example, appropriate connectors may be provided. However, it may be also possible that the RF circuitry is connected to the antennas directly by soldering or the like.

In a possible embodiment, the antenna arrangement, in particular the individual antennas of the antenna arrangement, may be implemented as an antenna on the chip device. For example, appropriate antenna structures for receiving RF waves may be realized on a chip, for example a silicon chip or the like. In this way, a very efficient and small sized antenna configuration can be realized.

In a possible embodiment, the antenna arrangement and the RF circuitry are implemented together as a system on a chip device. In such a configuration, both the individual antennas of the antenna arrangement and the RF circuitry including the components for adding and subtracting the RF waves may be implemented on a common chip. In this way, a very compact and small sized field probe can be realized.

In a possible embodiment, the field probe comprises a housing. The housing may accommodate the antenna arrangement and the RF circuitry. For example, the housing may shield the antennas and the RF circuitry against external impact such as unwanted electromagnetic disturbances or the like. The field probe with the antennas and the RF circuitry in a common housing may further comprise an output terminal for providing signals corresponding to the determined magnitude pattern and/or phase pattern. Accordingly, the signals corresponding to the magnitude pattern and the phase pattern may be provided to further devices by standardized low cost cables or the like. Thus, no complex and expensive components such as specialized RF cables, in particular phase stable cables, RF connectors, amplifiers, mixers or the like are required.

In a possible embodiment, the antenna arrangement may be configured to measure a radiation pattern of device under test having a diameter larger than one meter. In particular, the antenna arrangement of the field probe may measure large devices like cars, planes, ships or the like. However, it is understood, that any other device, in particular any kind of large sized device may be also measured by the field probe.

In a possible embodiment, the RF circuitry may be configured to add and subtract RF waves of continuous wave (CW) signals. Additionally or alternatively, the RF circuitry may be also configured to add and subtract RF waves of modulated RF signals. In general, the RF circuitry may be configured to perform measurements on any kind of RF signals received by the antennas of the antenna arrangement.

In a possible embodiment, the antenna arrangement may be configured to measure RF waves in a frequency range lower than 6 GHz. In particular, the antenna arrangement may be configured to measure RF waves in a frequency range 1 of 5G new radio (FR1 of 5G NR). However, the antenna arrangement and accordingly the field probe may also perform measurements for other appropriate frequency ranges, for example FR2.

With the present invention it is possible to perform phaseless RF measurements, in particular phaseless RF measurements for measuring antenna patterns or the like. The antenna measurement may be performed by a number of three or four antennas, wherein each of the antennas measures RF waves emitted by a device under test, for example an antenna under test. The measured RF signals of the individual antennas are added and subtracted, and based on the result of this adding and subtracting operations, magnitudes and phases can be determined. In this way, magnitude and phase measurements can be performed without directly taking into account phase information of measured RF signals. In this way, a measurement can be performed by a relative simple and cheap hardware.

BRIEF DESCRIPTION OF THE DRAWINGS

For a more complete understanding of the present invention and advantages thereof, reference is now made to the following description taking in conjunction with the accompanying drawings. The invention is explained in more detail below using exemplary embodiments, which are specified in the schematic figures and the drawings, in which.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown in scale.

In the drawings, same, functionally equivalent and identical operating elements, features and components are provided with same reference signs in each case, unless stated otherwise.

DETAILED DESCRIPTION

Figure 1:
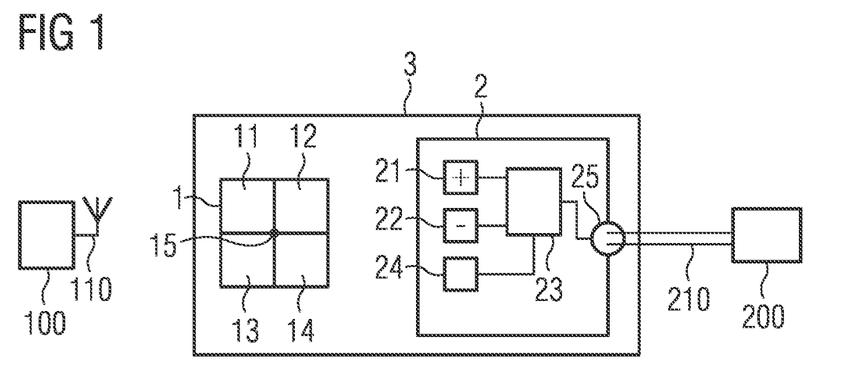
FIG. 1: shows a schematic block diagram of a measurement arrangement with a field probe according to an embodiment.

FIG. 1 shows a schematic block diagram of a measurement arrangement with a field probe according to an embodiment. As can be seen in FIG. 1, a device under test 100, in particular an antenna under test 110 may emit electromagnetic waves. In particular, the antenna under test 110 may have a specific radiation pattern. This antenna pattern may be measured by means of a field probe as described below in more detail. The field probe may measure radio frequency (RF) signals of the electromagnetic waves emitted by antenna 110. Based on the measured RF signals, the field probe determines values of a magnitude pattern and values of a phase pattern. The determined values of the magnitude and phase patterns may be provided to a measurement device 200. For example, a wired communication link 210 may be used for providing the signals according to the magnitude and phase patterns to the measurement device 200.

Since the signals relating to the magnitude and the phase patterns usually only comprise relative low frequency components, the signal may be transmitted via standard cables. In particular, it is not necessary to use specialized RF cables or connectors for coupling the output of the field probe with an input of the measurement device 200.

The field probe may comprise an antenna arrangement 1 and a RF circuitry 2. The antenna arrangement 1 and the RF circuitry 2 may be accommodated by a common housing 3. For example, the common housing may shield the components inside the housing 3 against electromagnetic disturbances or mechanical impact.

Antenna array 1 may comprise a number of individual antennas 11-14. In particular, antenna arrangement 1 may comprise an antenna arrangement with three or four antennas 11-14. The number of antennas 11-14 may be arranged, for example, on a common plane. The common plane may be perpendicular to an axis directing to the antenna under test 100. In particular, the number of antennas 11-14 may share a common center point 15. For example, the number of antennas 11-14 may be electrically coupled with each other at this common center point 15. It may possible that an edge of each antenna 11-15 is soldered to this common center point 15. Accordingly, the spatial arrangement of the individual antennas 11-14 with respect to each other may be firmly specified by sharing this common center point 15.

The antennas 11-14 of the antenna arrangement 1 may be any kind of appropriate antennas for receiving RF waves within a desired frequency range. For example, the antennas may be horn antennas, micro strip antennas or any other kind of appropriate antenna. Each antenna 11-14 may receive electromagnetic waves, in particular electromagnetic waves emitted by antenna under test 110. The antennas 11-14 may output a RF signal corresponding to the received waves.

As already mentioned above, the field probe further comprises a RF circuitry 2. RF circuitry 2 may be directly connected to the antennas 11-14 of antenna arrangement 1. For example, an output terminal of each antenna 11-14 may be electrically connected with a corresponding input terminal of RF circuitry 2. In particular, no further elements may be arranged between the output terminals of the antennas 11-14 and the corresponding input terminals of RF circuitry 2. However, if necessary, a small piece of RF conducting element, for example a short wire or the like may be used for electrically connecting the output terminals of the antennas 11-14 with the corresponding input terminals of the RF circuitry 2. If possible, such additional conductive elements may be omitted.

RF circuitry 2 may receive the signals of the RF waves measured by the antennas 11-14 of the antenna arrangement 1. Based on the received waves, RF circuitry 2 may determine values of patterns for specifying a magnitude and/or phases according to the RF waves measured by the antennas 11-14 of the antenna arrangement 1. The determination of the values for the magnitude and phase of the respective patterns will be described in the following in more detail.

RF circuitry 2 may comprise an adding device 21 and a subtracting device 22. Adding device 21 may receive the signals of the RF waves measured by the antennas 11-14 of the antenna arrangement 1 and add the RF signals provided by two of the antennas 11-14, respectively. Accordingly, a pairwise addition of the RF signals provided by the antennas 11-14 of the antenna arrangement 1 may be performed by adding device 21. For example, a separate adding unit may be provided for each operation of adding to RF signals. In particular, the adding of the RF signals may be performed only by means of passive components. In particular, no active elements such as amplifiers or the like may be used for adding the RF signals. Accordingly, each adding unit of the adding device 21 may output a sum of two received input signals. For example, adding device 21 may output a sum of each combination of two antennas 11-14. However, it may be also possible that only horizontally or vertically adjacent antennas 11-14 may be taken into account for building a sum of the respective RF signals. Any other scheme for selecting an appropriate number of combination for determining sums of RF signals may be also possible.

Similar to the operations of the adding device 21, subtracting device 22 may receive also the signals provided by the antennas 11-14 of the antenna arrangement 1 and determine a difference between two RF signals, respectively. The determination of the differences may be also performed by means of passive components without any active elements such as amplifiers or the like. The sums of the RF signals, which are generated by the adding device 21 and the differences, which are generated by the subtracting device 22 may be provided to a determination device 23. Determination device 23 may determine magnitude values and phase values based on the provided sums and differences of the RF signals. For example, determination device 23 may determine magnitude values, which may correspond to the sums of the RF signals from two antennas 11-14, respectively. Further, phase values may be determined by dividing a value of a difference between the signals of two antennas 11-14 by the sum of the two signals from the respective antennas 11-14. In this way, magnitude values and phase values can be determined based on the RF waves measured by the antennas 11-14 without taking into account the individual phases of the measured signals. Moreover, the magnitude and phase values may be determined only based on the values for the sum and the differences of the measured RF waves. The determination of the magnitude and the phase values can be performed completely by means of passive elements without the need of any active components. Further, the magnitude and phase values can be determined without referring to any reference phase or the like.

RF circuitry 2 may further comprise a power measurement device 24 for determining a power value of the measured RF waves. For example, a power value of each signal provided by the individual antennas 11-14 may be determined. For this purpose, power measurement device 24 may comprise any kind of appropriate component. In particular, the power measurement may be performed completely by means of passive elements such as a power measurement diode or the like. Accordingly, the result of the power measurement may be also taken into account for determining the magnitude and/or phase values. For example, the magnitude and phase values may be normalized based on the measured power values.

Accordingly, determination device 23 may provide appropriate patterns for characterizing the magnitude and/or phase of the RF waves measured by the antennas 11-14 of the antenna arrangement 1. For example, a 2×2 pattern according to the configuration of the antennas 11-14 of the antenna arrangement 1 may be provided. However, any other appropriate pattern may be possible, too. In particular, if only three antennas 11-14 may be used in the antenna arrangement 1, the configuration of the antenna pattern may be adapted accordingly.

The results of the magnitude and phase values may be provided by an output terminal 25 of the RF circuitry 2. For example, the results of all determined magnitude and phase values may be combined together to a single signal and provided at an output port of the RF circuitry 2. However, it may be also possible that the output terminal 25 of the RF circuitry 2 may comprise multiple ports. For example, a separate output port may be provided for each value of a determined magnitude or phase. The determined values for the magnitude and phase may be provided, for example, by analogue signals corresponding to the determined value, respectively. However, any other scheme for providing the determined values may be possible, too. For example, the determined values may be also provided by a pulse width modulated signal or the like. Since the determined values for the magnitude and the phase can be provided with signals having only low frequency components, no specialized requirements have to be considered for signal lines 210 connecting an output terminal of the RF circuitry 2 with a further measurement device 200. In particular, no specialized RF cables, in particular no phase stabilized cables are required for connecting the field probe with a measurement device 200.

Based on the determined values for the magnitude and the phase, any kind of appropriate analysis may be performed. For example, the determined values may be used for analyzing a radiation pattern of the antenna under test 110. In particular, it may be possible to measure a near field of the antenna under test 110. Since it is possible to determine magnitude values and phase values of the measured antenna pattern, the results may be also used, for example, for a near field to far field transformation.

The field probe may be used for measuring any kind of RF waves. In particular, it may be possible to measure RF waves of continuous wave signals emitted by an antenna 110 of the device under test 100. However, it may be also possible that the measurement of the field probe may be applied to modulated signals.

The field probe may be used for measuring magnitude and phase in any appropriate range. For this purpose, the configuration of the individual components such as the antennas 11-14 and the properties of the components used for the RF circuitry 2 may be adapted to the desired frequency range. For example, the field probe may be used for measuring electromagnetic waves in a frequency range up to 6 GHz. In particular, the field probe may be used for measuring signals in a frequency range 1 of 5G new radio (FR1 of 5G NR). However, it may be also possible to perform measurements in any other appropriate frequency range, for example FR2 of 5G NR.

The Field probe may be realized, for example, by means of conventional discrete components. As already mentioned above, it is desirable to directly connect the antennas 11-14 of the antenna array 1 with the RF circuitry 2. However, it may be also possible, to use, for example a so-called antenna-on-chip device. Accordingly, the configuration of the antennas 11-14 used for the antenna arrangement 1 may be realized on an arrangement of a single chip carrier, for example a silicon waver or the like.

Furthermore, it may be even possible to realize the whole arrangement of antenna array 1 and RF circuitry 2 by a single system on-chip arrangement. In such a system on-chip arrangement, the components of the antenna arrangement 1 and the RF circuitry 2 may be all implemented on a single chip, for example on a common silicon waver.

The field probe as described above may be used for measuring radiation patterns of any kind of device under test 110 emitting electromagnetic waves. For example, the field probe may be used for measuring an antenna pattern of an antenna or antenna system of a communication system such as a base station or a mobile communication device. However, it may be also possible to use the field probe for measuring electromagnetic properties of any other devices. For example, it may be possible to measure electromagnetic properties of large size devices such as a car, a truck, a ship, an airborne device such as a plane, a satellite or any device emitting electromagnetic waves. In particular, it may possible to measure electromagnetic properties of devices having large size, for example a size with a diameter larger than 1 m, larger than 2 m, larger than 5 m or even larger than 10 m.

Figure 2:
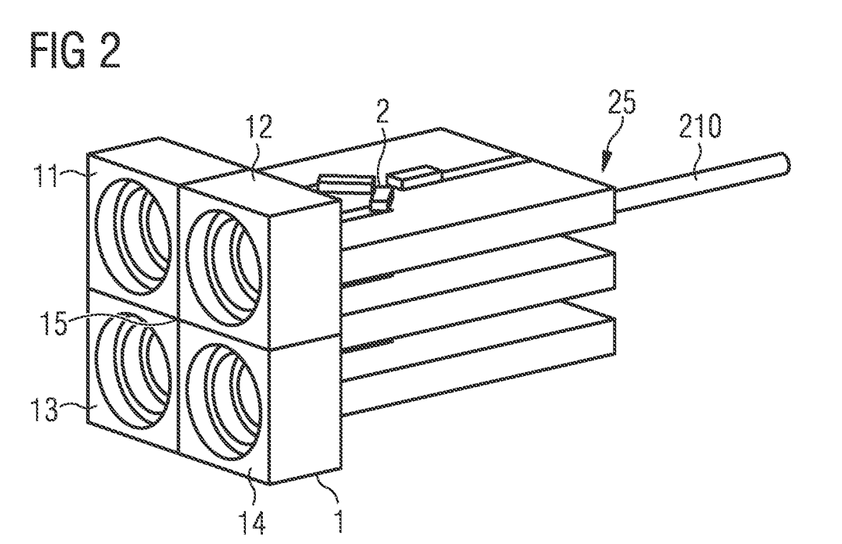
FIG. 2: shows a schematic illustration of a field probe according to an embodiment.

FIG. 2 shows a schematic illustration of a field probe according to an embodiment. As can be seen in this illustration, antenna arrangement 1 may comprise four antennas 11-14 having an almost squared shape. The antennas 11-14 may share a common center point 15. As already mentioned above, the antennas 11-14 may be electrically coupled at this shared center point 15. Further to this, the field probe comprises one or more RF circuitries 2, which are directly connected to the antennas 11-14. Accordingly, no additional cable connection is required for connecting the output ports of the antennas 11-14 with the input ports of RF circuitry 2. The result of the RF circuitry 2, i.e. the determined magnitudes and phases may be provided to a further measurement device 200 by an appropriate output port 25. As already mentioned above, a simple signal line may be used for connecting the output port 25 of the RF circuitry 2 with the measurement device 200.

Figure 3:
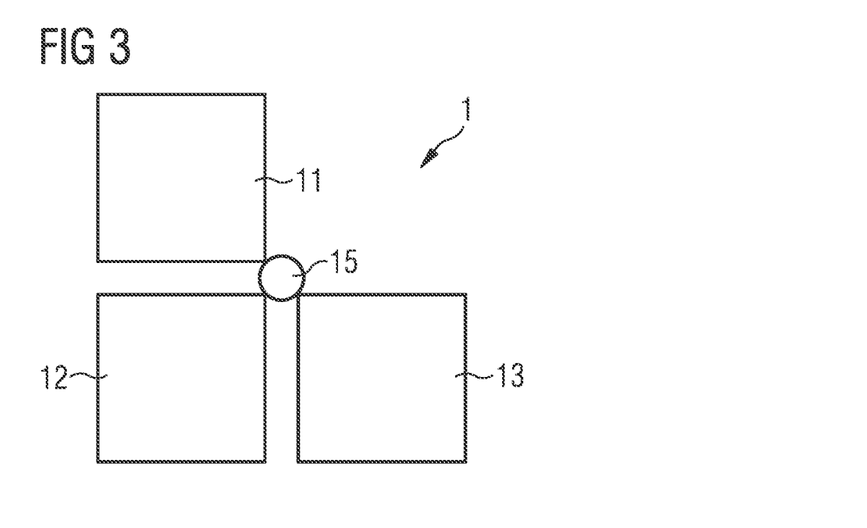
FIG. 3: shows a schematic diagram of an antenna arrangement of a field probe according to another embodiment.

FIG. 3 shows a schematic illustration of an antenna arrangement 1 according to an embodiment. As it has been already mentioned above, antenna arrangement 1 may comprise three or four antennas 11-14. Even though, preferably four antenna elements 11-14 may be used, it may be also possible to implement the field probe by means of only three antennas 11-13 as shown in FIG. 3. Accordingly, this configuration with only three antennas 11-13 also allows a determination of magnitudes and phase values in horizontal and vertical direction. However, it is understood, that the configuration of the antennas 11-14 as shown in the examples according to FIGS. 1 to 3 do not limit the scope of the present invention. Moreover, any other appropriate configuration of an antenna arrangement 1 with three or four antennas 11-14 may be possible, too.

Figure 4:
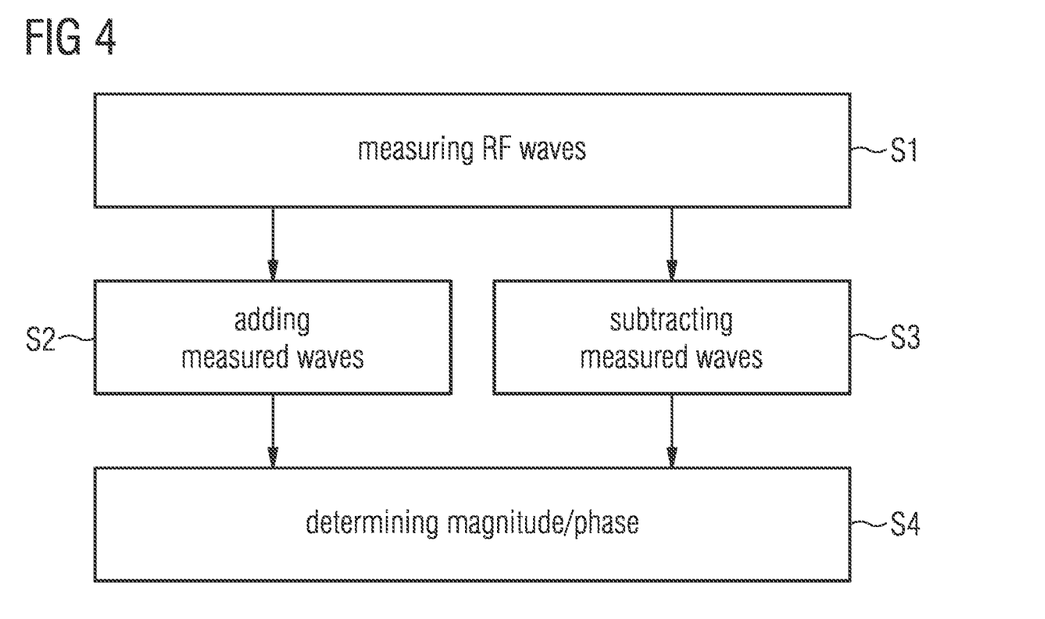
FIG. 4: shows a flow diagram of a method for conducting antenna measurements according to an embodiment.

FIG. 4 shows a flow diagram illustrating a method for conducting antenna measurement according to an embodiment. The method may comprise any step for performing an operation as already described above in connection with the field probe. Accordingly, the above described field probe may comprise any kind of element for performing an operation as described below in connection with the method.

The method for conducting antenna measurements, in particular for conducting antenna elements by phaseless measurements may comprise a step S1 for measuring a radio frequency waves. The RF waves may be measured by an antenna arrangement comprising a number of three or four antennas, wherein the number of antennas shares a common center point 15.

The method further may comprise a step S2 of adding the measured RF waves, and a step S3 of subtracting the measured RF waves. In particular, measured RF waves may be added and subtracted in a pairwise manner.

Further, the method may comprise a step S4 of determining a magnitude pattern of the device under test. Additionally or alternatively, step S4 may determine a phase pattern of the device under test 100. The magnitude pattern and/or the phase pattern may be determine based on the results of the added RF waves and the subtracted RF waves.

Summarizing, the present invention provides a field probe for conducting antenna measurements by phaseless measurements. An antenna arrangement with three or four antennas measures RF waves. The measured RF waves are pairwise added and subtracted. Based on the result of the adding and subtracting operations, magnitude patterns and phase patterns are determined. In this way, magnitude and phase patterns of electromagnetic waves emitted by a device under test can be determined by a completely passive device.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

LIST OF REFERENCE SIGNS 1 antenna arrangement
2 RF circuitry
3 housing
11-14 antennas
15 center point
21 adding device
22 subtracting device
23 determining device
24 power measurement device
25 output terminal
100 device under test
110 antenna under test
200 measurement device
210 signal line
S1 . . . S4 method steps

The invention claimed is:

1. A field probe for conducting antenna measurements by phaseless measurements, the field probe comprising: an antenna arrangement comprising a number of three or four antennas, wherein the number of antennas share a common center point, and each of the number of antennas is configured to measure radio frequency waves emitted by a device under test; and a radio frequency, RF, circuitry, directly connected to the number of antennas and configured to receive the measured RF waves from each of the number of antennas, add the measured RF waves, subtract the measured RF waves, and determine at least one of a magnitude pattern and a phase pattern of the device under test based on the results of the added RF waves and the subtracted RF waves, wherein the RF circuitry is configured to determine magnitude values of the magnitude pattern only based on the sums of the added RF waves, and wherein the RF circuitry is configured to determine phase values of the phase pattern by dividing the differences of the subtracted RF waves by the corresponding sums of the added RF waves.

2. The field probe of claim 1, wherein the RF circuitry comprises an adding device configured to add the measured RF waves in pairs.

3. The field probe of claim 2, wherein the RF circuitry comprises a subtracting device configured to subtract the measured RF waves in pairs.

4. The field probe of claim 1, wherein the RF circuitry comprises a power measurement device configured to determine a power value of the measured RF waves, and
wherein the RF circuitry is configured to determine the magnitude values and the phase values by further considering the determined power values.

5. The field probe of claim 1, wherein the magnitude pattern and a phase pattern are determined without referring to a reference phase.

6. The field probe of claim 1, wherein the RF circuitry is arranged on a printed circuit board, and
wherein the printed circuit board is directly coupled to the antenna arrangement.

7. The field probe of claim 6, wherein the number of antennas are connected to the printed circuit board without any additional wire.

8. The field probe of claim 1, wherein the antenna arrangement is implemented as an antenna-on-chip device.

9. The field probe of claim 1, wherein the antenna arrangement and the RF circuitry are implemented as a system-on-chip device.

10. The field probe of claim 1, comprising a housing accommodating the antenna arrangement and the RF circuitry.

11. The field probe of claim 1, wherein the RF circuitry comprises an output terminal configured to output an output signal according to the determined magnitude pattern and the determined phase pattern.

12. The field probe of claim 1, wherein the RF circuitry is configured to add and subtract RF waves of continuous wave signals or modulated RF signals.

13. The field probe of claim 1, wherein the antenna arrangement is configured to measure RF waves in a frequency range up to 6 GHz, in particular in a frequency range 1, FR1, of 5G new radio, 5G NR.

14. The field probe of claim 1, wherein the antenna arrangement is configured to measure a radiation pattern of a device under test having a diameter lager than 1 meter.

15. A method for conducting antenna measurements by phaseless measurements, the method comprising:
  measuring radio frequency, RF, waves by an antenna arrangement comprising a number of three or four antennas, wherein the number of antennas share a common center point;
  adding the measured RF waves;
  subtracting the measured RF waves; and
  determining at least one of a magnitude pattern and a phase pattern of the device under test based on the results of the added RF waves and the subtracted RF waves,
  wherein magnitude values of the magnitude pattern are determined only based on the sums of the added RF waves, and
  wherein phase values of the phase pattern are determined by dividing the differences of the subtracted RF waves by the corresponding sums of the added RF waves.

* * * * *